(12) United States Patent
Kim et al.

(10) Patent No.: US 7,545,081 B2
(45) Date of Patent: Jun. 9, 2009

(54) PIEZOELECTRIC RF MEMS DEVICE AND METHOD OF FABRICATING THE SAME

(75) Inventors: Jong-seok Kim, Hwaseong-si (KR); In-sang Song, Seoul (KR); Sang-hun Lee, Seoul (KR); Sang-wook Kwon, Seongnam-si (KR); Chang-seung Lee, Yongin-si (KR); Young-tack Houng, Suwon-si (KR); Che-heung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 11/594,813

(22) Filed: Nov. 9, 2006

(65) Prior Publication Data

US 2007/0120445 A1    May 31, 2007

(30) Foreign Application Priority Data

Nov. 30, 2005    (KR) ...................... 10-2005-0115971

(51) Int. Cl.
*H01L 41/08* (2006.01)
(52) U.S. Cl. .................. 310/330; 310/332; 200/181; 200/219
(58) Field of Classification Search ......... 310/330–332, 310/328
See application file for complete search history.

(56) References Cited

U.S. PATENT DOCUMENTS

| | | | | |
|---|---|---|---|---|
| 4,697,118 A | * | 9/1987 | Harnden et al. | 310/331 |
| 4,714,847 A | * | 12/1987 | Harnden et al. | 310/332 |
| 4,742,263 A | * | 5/1988 | Harnden et al. | 310/331 |
| 5,796,377 A | * | 8/1998 | Gonzalez et al. | 345/84 |
| 7,012,354 B2 | * | 3/2006 | Wong | 310/328 |
| 7,132,723 B2 | * | 11/2006 | Park et al. | 257/419 |

FOREIGN PATENT DOCUMENTS

| | | |
|---|---|---|
| EP | 1555713 A1 | 7/2005 |
| KR | 10-2005-0076149 A | 7/2005 |

* cited by examiner

*Primary Examiner*—Mark Budd
(74) *Attorney, Agent, or Firm*—Sughrue Mion, PLLC

(57) ABSTRACT

A piezoelectric RF micro electro mechanical system (MEMS) device and a method of fabricating the same are provided, in which the RF MEMS device is driven upward at a low voltage based on a piezoelectric effect. The piezoelectric RF MEMS device includes an upper substrate provided with an RF output signal line, a piezoelectric actuator positioned below the RF output signal line, and a lower substrate provided with a cavity so that one end of the piezoelectric actuator is fixed to the lower substrate and its other end is movably spaced apart from the upper and lower substrates, wherein the piezoelectric actuator is provided with an RF input signal line thereon, and a contact pad is provided to connect the RF output signal line with the RF input signal line when the piezoelectric actuator is driven upward. A method of fabricating a piezoelectric RF MEMS device includes providing an upper substrate including an RF output signal line, providing a lower substrate including a piezoelectric actuator having an RF input signal line corresponding to the RF output signal line, and assembling the upper substrate and the lower substrate.

12 Claims, 10 Drawing Sheets

PIEZOELECTRIC RF MEMS DEVICE AND METHOD OF FABRICATING THE SAME

CROSS-REFERENCE TO RELATED APPLICATIONS

This application claims priority under 35 U.S.C. § 119 from Korean Patent Application No. 10-2005-0115971, filed on Nov. 30, 2005, the entire content of which is incorporated herein by reference.

BACKGROUND OF THE INVENTION

1. Field of the Invention

Apparatuses and methods consistent with the present invention relate to a piezoelectric radio frequency (RF) micro electro mechanical system (MEMS) device and a method of fabricating the same, and, more particularly, to a piezoelectric RF MEMS device and a method of fabricating the same, in which a piezoelectric actuator is provided with an RF input signal line for one point contact at a low voltage and the RF MEMS device is fabricated as one package.

2. Description of the Related Art

An RF MEMS device is used as a multi-function switch, a relay, a capacitor or a phase shifter in various fields such as radar, mobile and communication products. Examples of the RF MEMS device include an electrostatic RF MEMS device based on electrostatic phenomenon and a piezoelectric RF MEMS device based on a piezoelectric effect. However, the electrostatic RF MEMS device requires a high driving voltage of 3V and has a large volume. In this respect, the piezoelectric RF MEMS device is being widely used.

FIG. 1 illustrates a piezoelectric RF MEMS switch which is one of related art RF MEMS devices. FIG. 1A is a plane view illustrating the piezoelectric RF MEMS switch, FIG. 1B is a sectional view taken along line A-A of FIG. 1A, and FIG. 1C is a plane view illustrating a lower substrate of the piezoelectric RF MEMS switch. The piezoelectric RF MEMS switch 1 is disclosed in the Korean Patent Laid-Open Publication No. 10-2005-0076149. As shown in FIGS. 1A to 1C, the piezoelectric RF MEMS switch 1 includes an upper substrate 10, a lower substrate 20 provided with RF input and output signal lines 21 and 22, a piezoelectric actuator 30 whose one end is fixed to the upper substrate 10 and other end is spaced apart from the lower substrate 20, and a contact pad 34 arranged on an end of the piezoelectric actuator 30. The piezoelectric actuator 30 is formed below the upper substrate 10, and has a structure that a piezoelectric layer 33 such as lead zirconate titanate (PZT, $Pb(Zr,Ti)O_3$) is interposed between an upper electrode 31 and a lower electrode 32. An elastic layer 12 is formed between the upper substrate 10 and the upper electrode 31. The upper substrate 10 is a semiconductor wafer substrate, and the end of the piezoelectric actuator 30 is positioned in a trench area 13 of the upper substrate 13. The lower substrate 20 is provided with a coplanar waveguide (CPW) lines such as bumps 23 and 24 in addition to the RF input and output signal lines 21 and 22.

Unlike the electrostatic RF MEMS switch, the aforementioned piezoelectric RF MEMS switch 1 can be driven at a low voltage. Also, the piezoelectric RF MEMS switch 1 is relatively smaller than the electrostatic RF MEMS switch, and has a switching speed faster than that of the electrostatic RF MEMS switch. In the piezoelectric RF MEMS switch 1, if an external voltage is applied to the upper and lower electrodes 31 and 32 of the piezoelectric actuator 30 through the bumps 23 and 24 of the lower substrate 20, moment occurs in the piezoelectric layer 33 to down bend the piezoelectric actuator 30, and the contact pad 34 contacts the RF input and output signal lines 21 and 22 to transmit an RF signal to an RF circuit board, i.e., the lower substrate 20. However, in the piezoelectric RF MEMS switch 1, the contact pad 34 of the piezoelectric actuator 30 contacts the RF signal lines 21 and 22 at two points. This two-point contact manner deteriorates stability of the switching operation in comparison with one point contact manner.

SUMMARY OF THE INVENTION

Accordingly, the present invention is directed to a piezoelectric RF MEMS device and a method of fabricating the same to address one or more problems due to limitations and disadvantages of the related art.

An aspect of the present invention is to provide a piezoelectric RF MEMS device, in which a piezoelectric actuator is provided with an RF input signal line for one point contact at a low voltage.

Another aspect of the present invention is to provide a method of fabricating a piezoelectric RF MEMS device, in which the RF MEMS device is fabricated as one package.

To achieve these and other aspects and in accordance with the purpose of the invention, as embodied and broadly described herein, a piezoelectric RF MEMS device includes an upper substrate provided with an RF output signal line, a piezoelectric actuator positioned below the RF output signal line, and a lower substrate provided with a cavity so that one end of the piezoelectric actuator is fixed to the lower substrate and its other end is movably spaced apart from the upper and lower substrates, wherein the piezoelectric actuator is provided with an RF input signal line thereon, and a contact pad is provided to connect the RF output signal line with the RF input signal line when the piezoelectric actuator is driven upward.

The upper substrate is provided with at least one via hole that electrically contacts the RF input and output signal lines.

The piezoelectric actuator comprises one beam or a pair of beams. Preferably, but not necessarily, the piezoelectric actuator is provided with the RF input signal line, a second passivation layer, an upper electrode, a piezoelectric layer, a lower electrode, and a membrane, in due order from the top. The upper electrode and the lower electrode are respectively connected with their driving lines.

Preferably, but not necessarily, the cavity is positioned below the piezoelectric actuator.

Also, it is preferable, but not necessary, that the contact pad is formed on an upper end of the piezoelectric actuator.

The upper substrate and/or the lower substrate may be provided with at least one CPW line.

Preferably, but not necessarily, the upper substrate and the lower substrate are bonded to each other.

The piezoelectric RF MEMS device further includes a first passivation layer formed on a surface of the lower substrate.

In another aspect of the present invention, a method of fabricating a piezoelectric RF MEMS device includes providing an upper substrate including an RF output signal line, providing a lower substrate including a piezoelectric actuator having an RF input signal line corresponding to the RF output signal line, and assembling the upper substrate and the lower substrate.

The operation of providing the upper substrate includes forming an insulating layer on one surface of a first wafer and patterning the insulating layer, forming a via hole by processing the patterned insulating layer, and forming the RF output signal line on a surface of the first wafer provided with the via hole.

The operation of preparing the lower substrate includes forming a cavity in a second wafer, forming a first passivation layer on the second wafer provided with the cavity, and fabricating a piezoelectric actuator provided with the RF input signal line above the cavity.

The operation of fabricating the piezoelectric actuator includes forming a sacrificing layer in the cavity, sequentially forming a membrane layer, a lower electrode layer, a piezoelectric layer, an upper electrode layer, a second passivation layer, an RF input signal line and a contact pad layer on the sacrificing layer and patterning them, and removing the sacrificing layer.

The first passivation layer and/or the second passivation layer are formed of silicon oxide or silicon nitride.

The sacrificing layer is formed of any one of polysilicon, low temperature oxide (LTO), tetraethyl orthosilicate (TEOS), polymer for photoresist, metal, and alloy.

The membrane layer is formed of any one of silicon nitride, aluminum nitride, polysilicon oxide, TEOS, Mo, Ta, Pt and Rh.

The upper electrode and the lower electrode are formed of any one of Pt, Rh, Ta, Au, Mo and AuPt.

The piezoelectric layer is formed of a piezoelectric material such as zirconate titanate (PZT), barium titanate, indium tin oxide (ITO), zinc oxide, and aluminum nitride.

The RF signal lines are formed of any one of Rh, Ti, Ta, Pt and AuNix.

The operation of assembling the upper substrate and the lower substrate includes bonding the upper substrate and the lower substrate to each other after fixing the upper substrate to the lower substrate.

BRIEF DESCRIPTION OF THE DRAWINGS

The above aspects and features of the present invention will be more apparent by describing certain exemplary embodiments of the present invention with reference to the accompanying drawings, in which.

According to an exemplary embodiment of the present invention.

According to an exemplary embodiment of the present invention.

DETAILED DESCRIPTION OF EXEMPLARY EMBODIMENTS

Reference will now be made in detail to exemplary embodiments of the present invention, examples of which are illustrated in the accompanying drawings. Wherever possible, the same reference numbers will be used throughout the drawings to refer to the same or like parts.

Figure 1A:
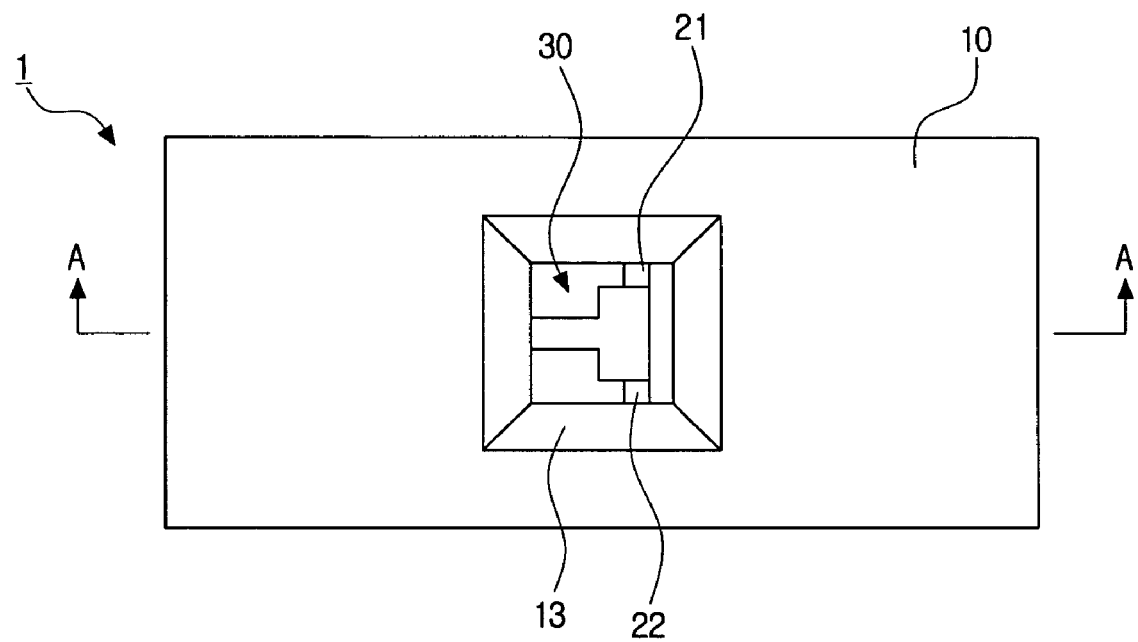
FIG. 1A is a plane view illustrating the related art piezoelectric RF MEMS device.
Figure 1B:
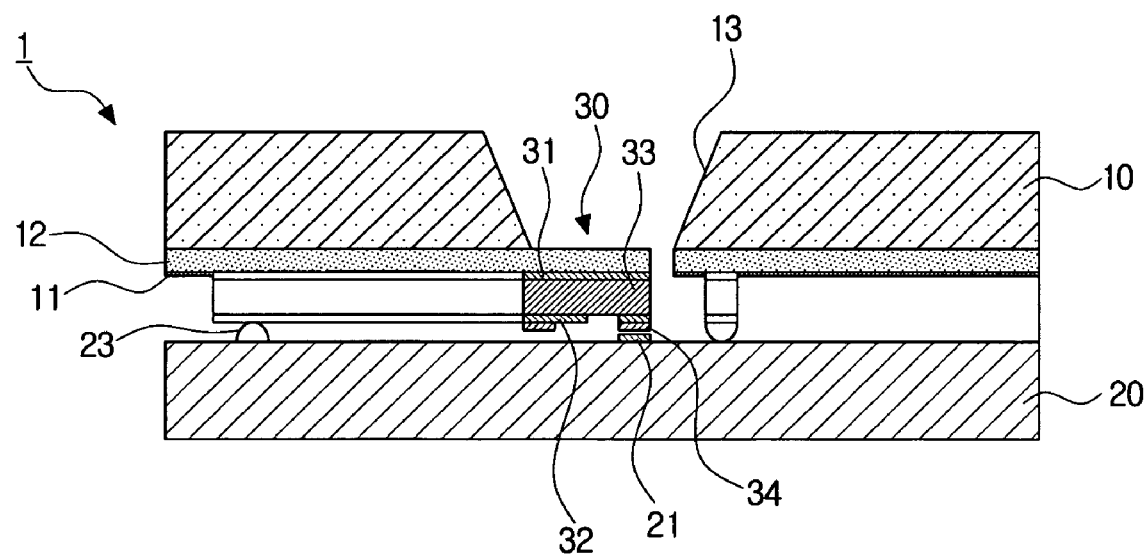
FIG. 1B is a sectional view taken along line A-A of FIG. 1A.
Figure 1C:
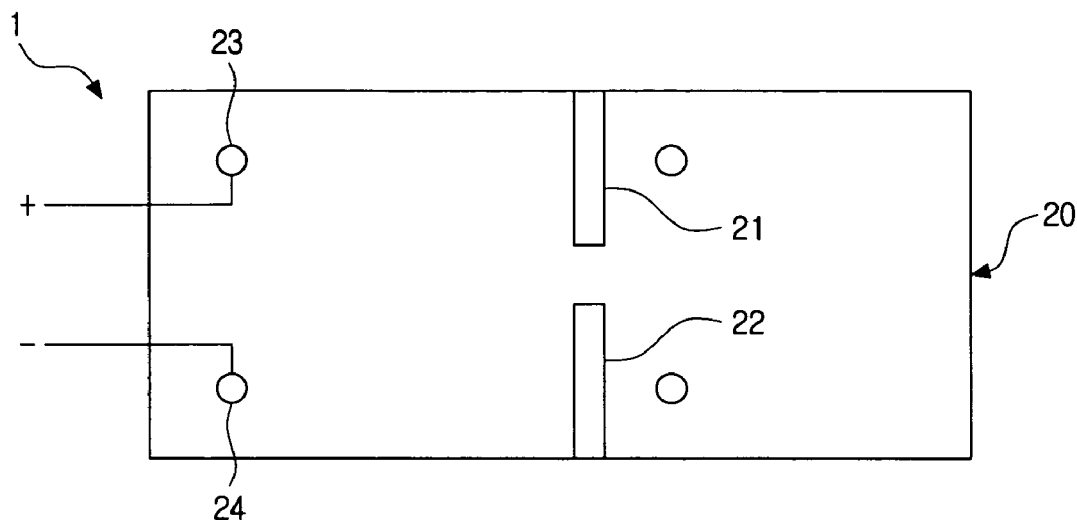
FIG. 1C is a plane view illustrating a lower substrate of the related art piezoelectric RF MEMS device.
Figure 2A:
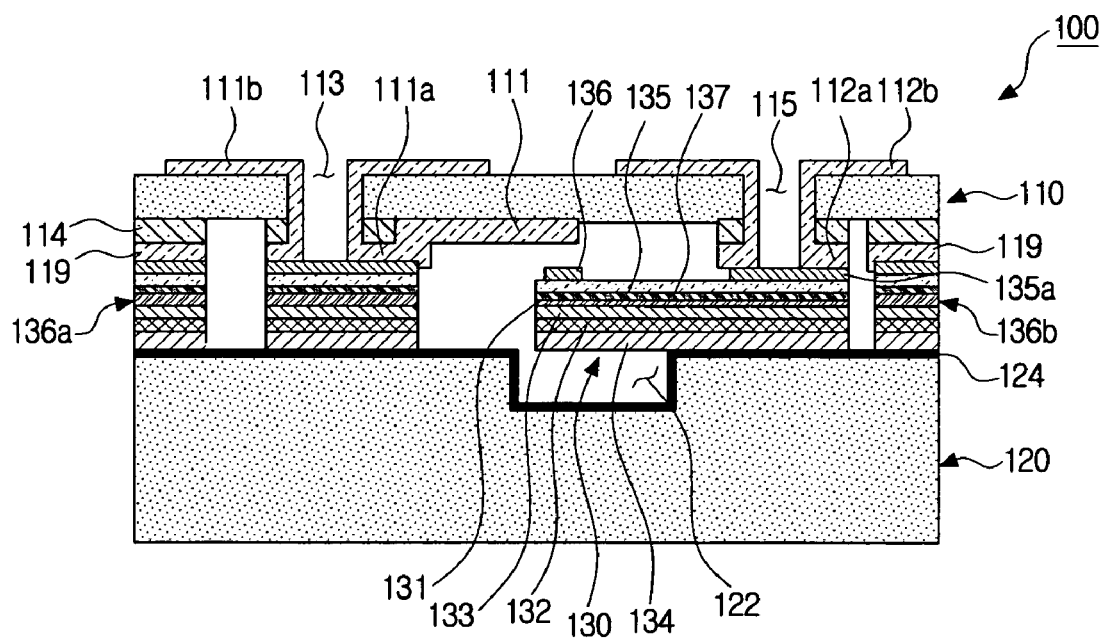
FIG. 2A is a front view illustrating the piezoelectric RF MEMS device.
Figure 2B:
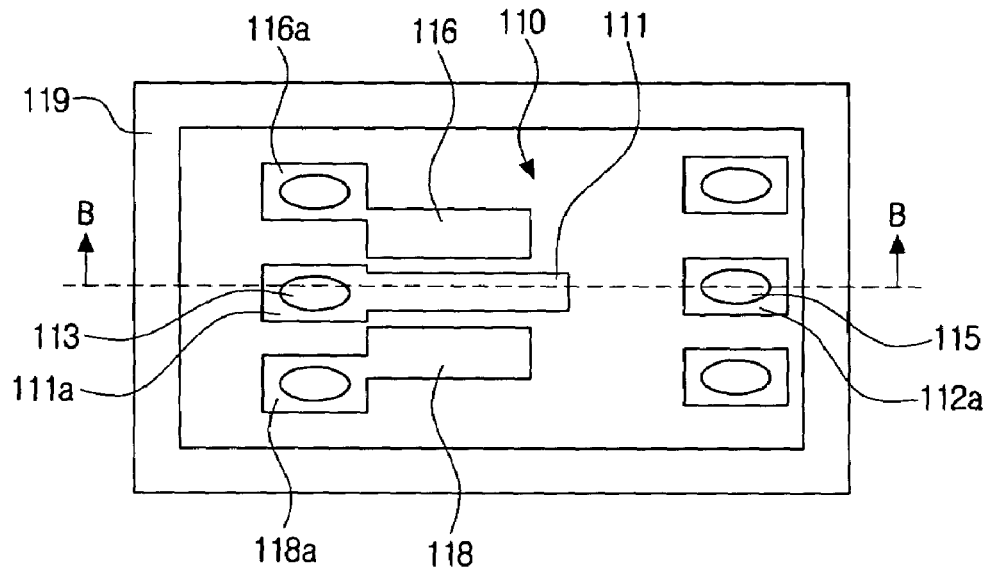
FIG. 2B is a bottom view illustrating an upper substrate of the piezoelectric RF MEMS device.
Figure 2C:
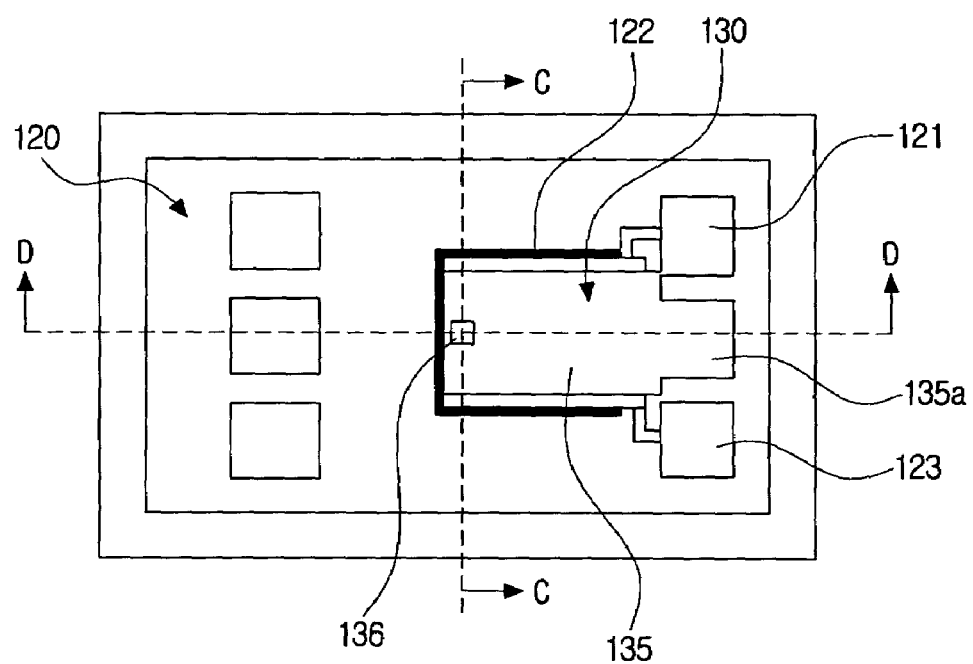
FIG. 2C is a plane view illustrating a lower substrate of the piezoelectric RF MEMS device.

FIG. 2 illustrates a piezoelectric RF MEMS device according to an exemplary embodiment of the present invention, in which FIG. 2A is a front view illustrating the piezoelectric RF MEMS device, FIG. 2B is a bottom view illustrating an upper substrate of the piezoelectric RF MEMS device, and FIG. 2C is a plane view illustrating a lower substrate of the piezoelectric RF MEMS device.

As shown in FIG. 2A to FIG. 2C, the RF MEMS device 100 of the present invention includes an upper substrate 110, a piezoelectric actuator 130, and a lower substrate 120. The RF MEMS device 100 is provided as one package.

The upper substrate 110 is provided with an RF output signal 111 at one surface, preferably, but not necessarily, a lower surface. The RF output signal line 111 may be provided with ground lines 116 and 118 at both sides. The RF output signal line 111 may electrically be connected with CPW lines of the upper substrate 110 through contact pads 111a and 111b and a via hole 113. Likewise, the ground lines 116 and 118 are externally grounded through contact pads 116a and 118a and a via hole. The upper substrate 110 may be provided with a via hole 115 and another contact pad 112a connected with the piezoelectric actuator 130 of the lower substrate 120. Such connection of the upper substrate 110 may optionally be controlled depending on design.

The piezoelectric actuator 130 is positioned below the RF output signal line 111 of the upper substrate 110. The piezoelectric actuator 130 has one end fixed to the lower substrate 120 and the other end movably spaced apart from the upper and lower substrates 110 and 120. The lower substrate 120 is provided with a cavity 122 below the piezoelectric actuator 130. Since the other end of the piezoelectric actuator 130 is positioned on the cavity 122, it can freely move in a state that it is spaced apart from the upper and lower substrates 110 and 120.

The lower substrate 120 is provided with the piezoelectric actuator 130. Also, the lower substrate 120 may be provided with a CPW line. A first passivation layer 124 may further be formed on a surface of the lower substrate 120.

The piezoelectric actuator 130 may comprise one beam or a pair of beams. Preferably, but not necessarily, the piezoelectric actuator 130 may be provided with an RF input signal line 135, a second passivation layer 137, an upper electrode 131, a piezoelectric layer 133, a lower electrode 132, and a membrane 134 in due order. The upper electrode 131 and the lower electrode 132 may respectively be connected with a driving line through terminal pads 121 and 123. The membrane 134 is formed along a longitudinal direction of the piezoelectric actuator 130. Since the membrane 134 is formed below the lower electrode 131, the piezoelectric actuator 130 can be driven upward.

The RF input signal line 135 is formed on the piezoelectric actuator 130. When the piezoelectric actuator 130 is upward driven, the RF input signal line 135 contacts the RF output signal line 111 through a contact pad 136 so that the RF input and output signal lines 111 and 135 can electrically be connected with each other. In the RF MEMS device 100 of the present invention, since one RF signal line (RF input signal line 135 in FIG. 2C) is provided on the piezoelectric actuator 130, the RF input signal line 135 and the RF output signal line 111 form one point contact through the contact pad 136.

The upper substrate 110 and the lower substrate 120 are assembled into each other to form one package. Preferably, but not necessarily, the upper substrate 110 and the lower substrate 120 are assembled in such a manner that sidewalls 119, 136a, and 136b formed around the substrates 110 and 120 are bonded to one another in a state that they face one another. The sidewalls 119, 136a, and 136b are formed to reach outer circumferences of the substrates 110 and 120 when structures of the substrates 110 and 120 are formed.

Hereinafter, a method of fabricating a piezoelectric RF MEMS device according to an exemplary embodiment of the present invention will be described with reference to the accompanying drawings.

Figure 3A:
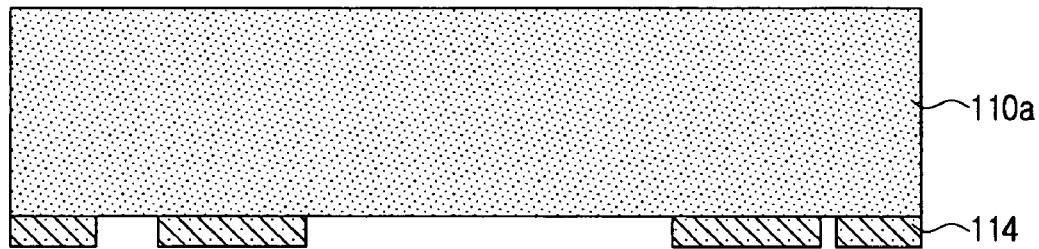
FIG. 3A to FIG. 3C are sectional views illustrating an upper substrate in a method of fabricating the upper substrate of the piezoelectric RF MEMS device according to an exemplary embodiment of the present invention.
Figure 3B:
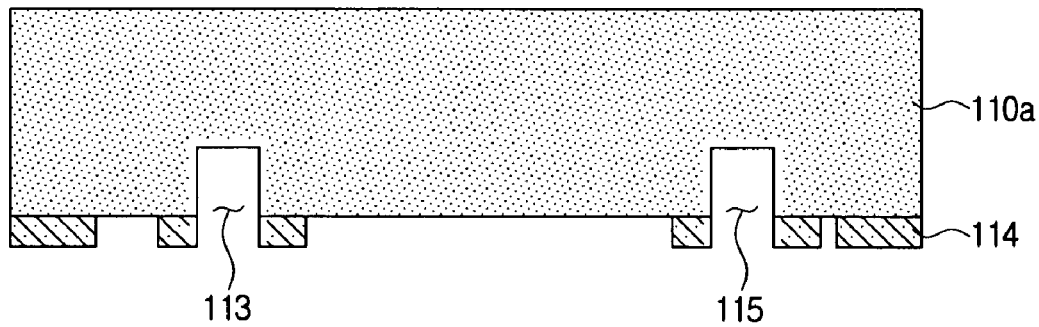
Figure 3C:
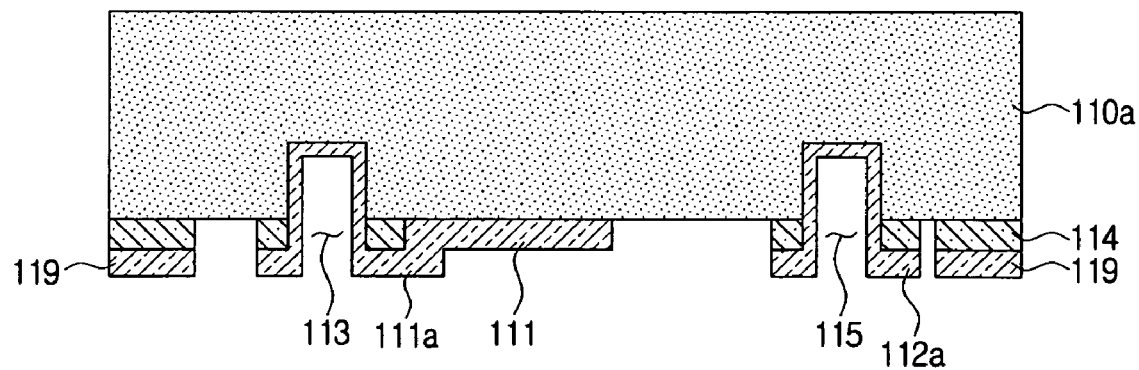
Figure 4A:
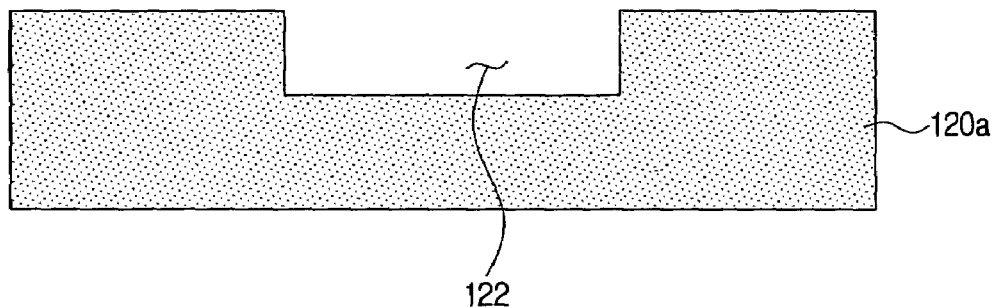
FIG. 4A to FIG. 4F are sectional views illustrating a lower substrate in a method of fabricating the lower substrate of the piezoelectric RF MEMS device according to an exemplary embodiment of the present invention.
Figure 4B:
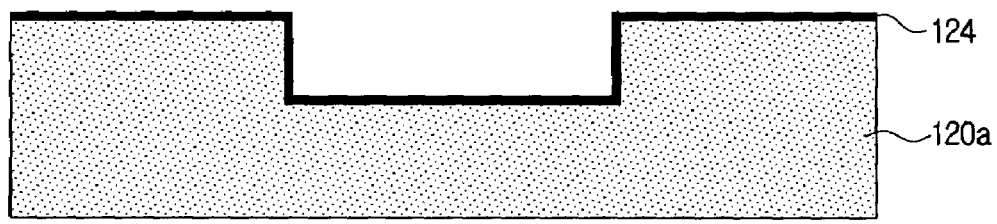
Figure 4C:
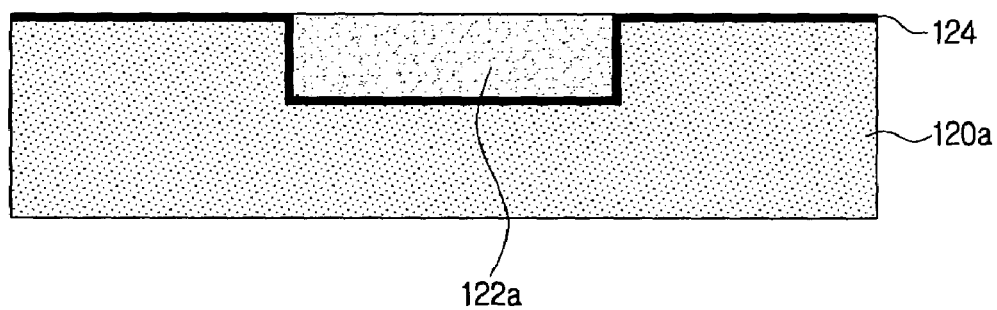
Figure 4D:
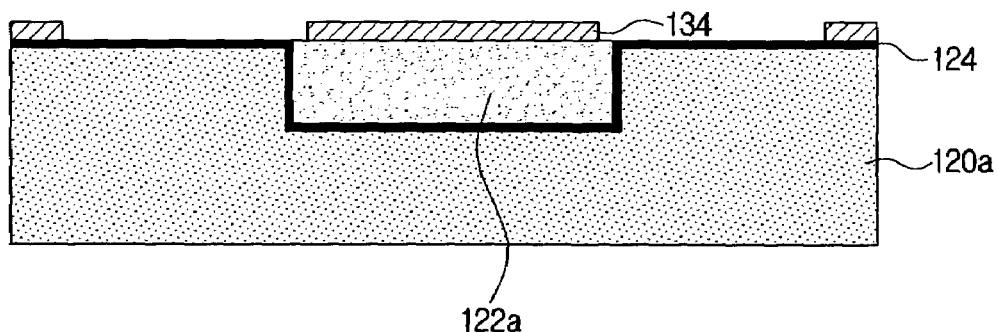
Figure 4E:
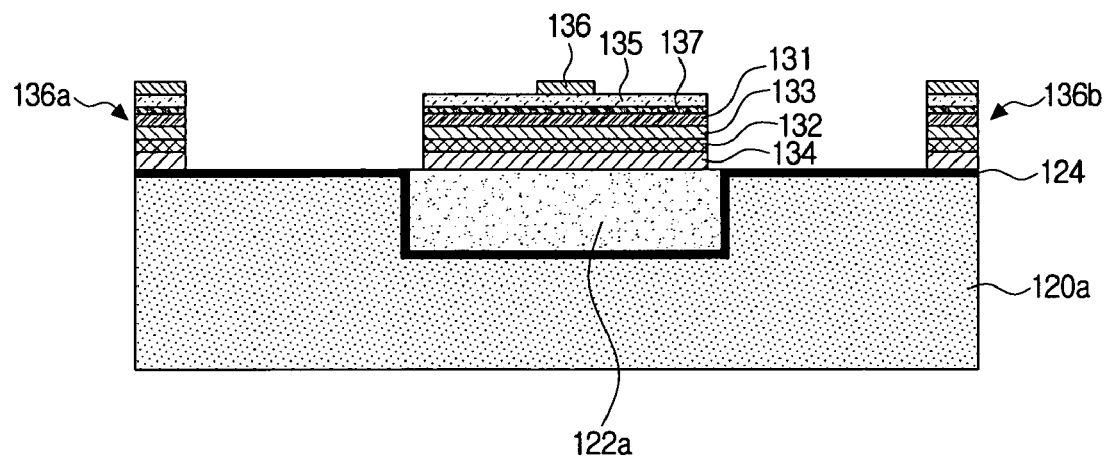
Figure 4F:
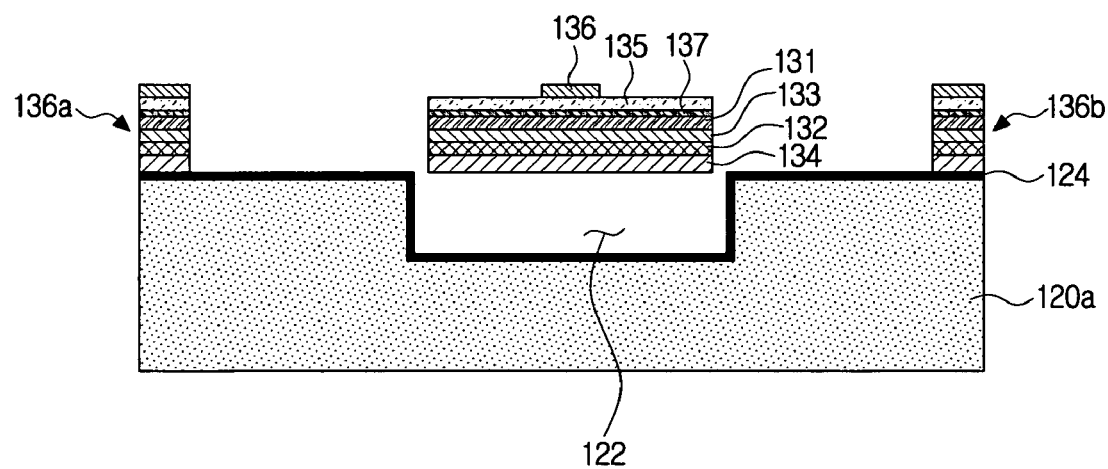
Figure 5A:
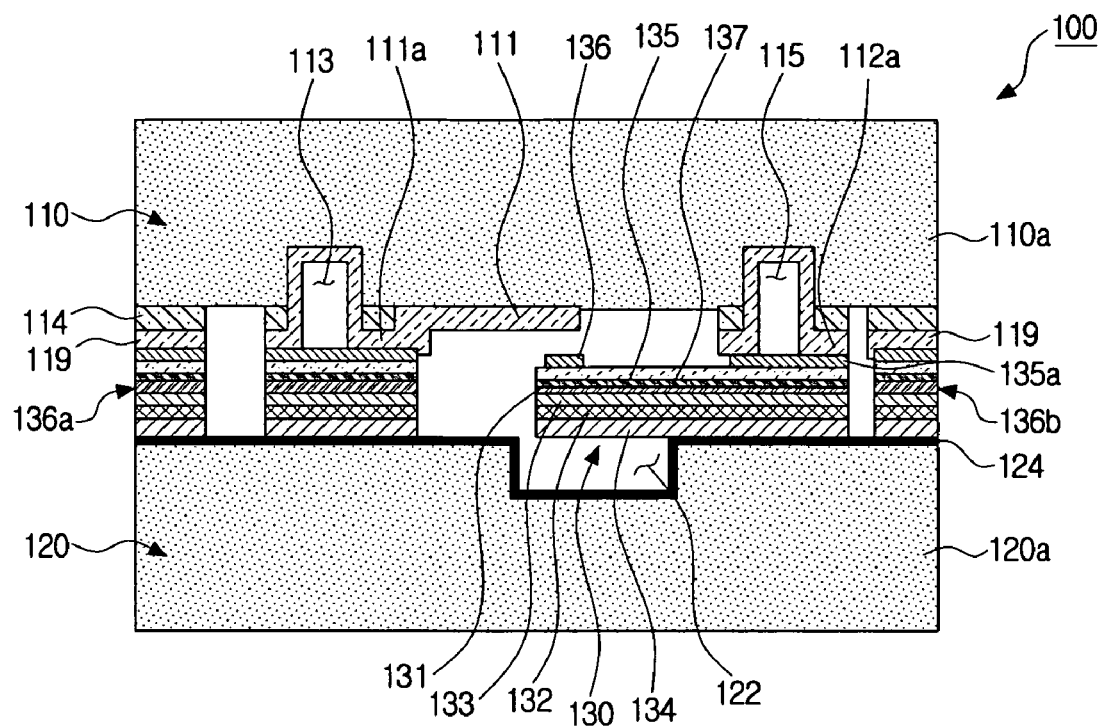
FIG. 5A to FIG. 5C are sectional views illustrating an assembly process of the upper and lower substrates of the piezoelectric RF MEMS device according to an exemplary embodiment of the present invention.
Figure 5B:
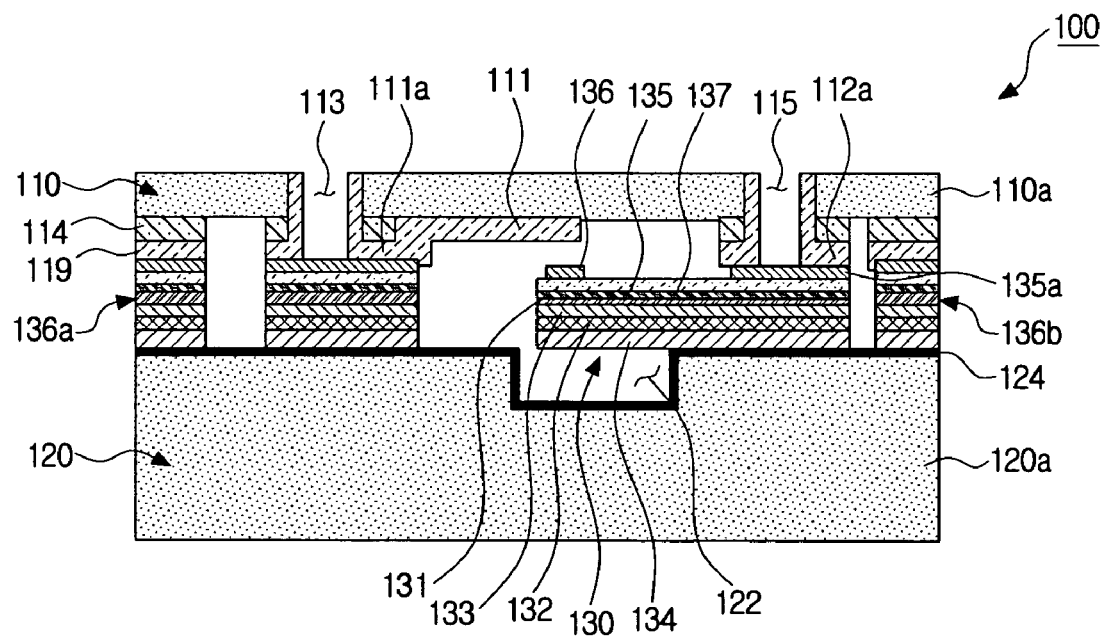
Figure 5C:
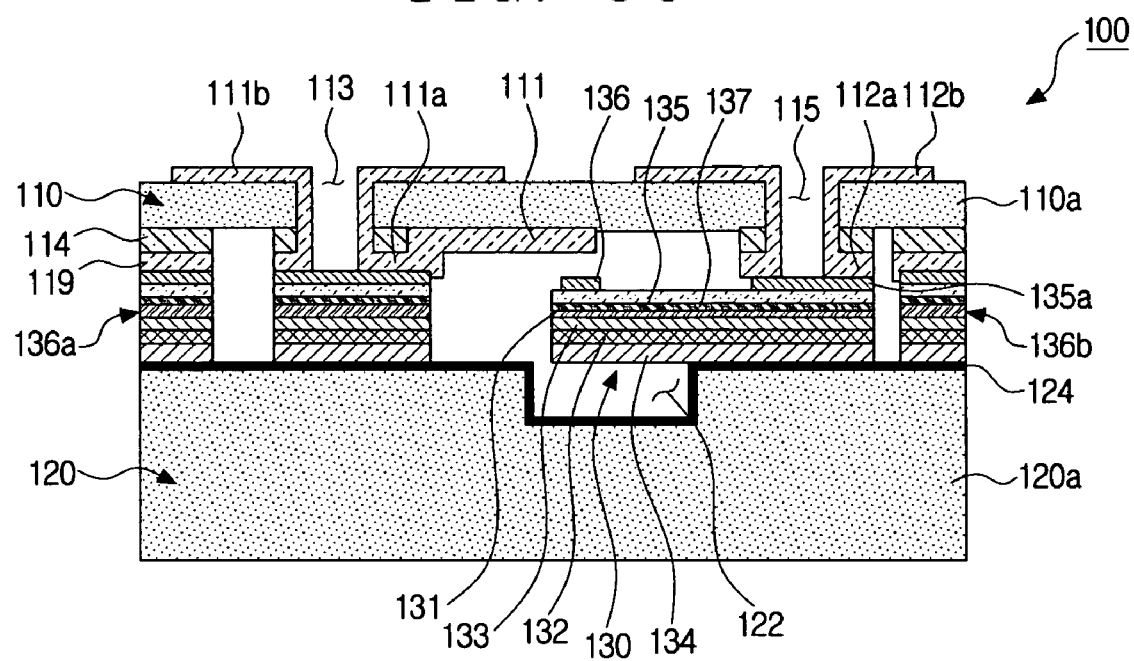

FIG. 3 to FIG. 5 are sectional views illustrating a method of fabricating a piezoelectric RF MEMS device according to an exemplary embodiment of the present invention. FIG. 3A to FIG. 3C are sectional views illustrating a method of fabricating the upper substrate 110, taken along line B-B of FIG. 2B. FIG. 4A to FIG. 4F are sectional views illustrating a method of fabricating the lower substrate 120, taken along line C-C of FIG. 2C. FIG. 5A to FIG. 5C are sectional views illustrating an assembly process of the upper and lower substrates 110 and 120, the upper substrate 110 being taken along line B-B of FIG. 2B and the lower substrate 120 being taken along line D-D of FIG. 2C.

The method of fabricating the piezoelectric RF MEMS device 100 according to an exemplary embodiment of the present invention includes respectively preparing the upper substrate 110 and the lower substrate 120, and assembling the substrates 110 and 120. In the exemplary embodiment of the present invention, the upper substrate 110 may be fabricated before or after the lower substrate 120 is fabricated.

To prepare the upper substrate 110, as shown in FIG. 3A to FIG. 3C, an insulating layer 114 is formed on one surface of a first wafer 110a and then is patterned to a desired design. A silicon wafer such as a high resistance silicon wafer or a high purity silicon wafer, a glass based wafer such as a fused silica, or a quart wafer may be used as the lower substrate 120 as well as the upper substrate 110.

The patterned insulating layer 114, i.e., the insulating layer pattern is processed by a laser to form the via holes 113 and 115. A conductive metal is plated or deposited on the surface of the first wafer 110a provided with the via holes 113 and 115. The conductive metal is then patterned to form the RF output signal line 111, the ground lines 116 and 118, and the contact pads 111a, 112a, 116a and 118a (see FIG. 2B). Preferably, but not necessarily, when the upper substrate 110 is fabricated, the sidewall 119 is formed at the outer circumference of the upper substrate 110.

Next, to prepare the lower substrate 120, as shown in FIG. 4A, a second wafer 120a is provided with a cavity 122. The cavity 122 can be formed by a typical etching process. As shown in FIG. 4B, the first passivation layer 124 is formed on the second wafer 120a provided with the cavity 122. The first passivation layer 124 can be formed by a typical deposition process. Silicon oxide such as $SiO_2$ or silicon nitride such as $Si_3N_4$ may be used as the first and second passivation layers 124 and 137.

Next, the piezoelectric actuator 130 provided with the RF input signal line 135 is fabricated on the cavity 122 (FIG. 4C to FIG. 4F). The piezoelectric actuator 130 is fabricated in such a manner that a sacrificing layer 122a is formed in the cavity 122, a membrane layer 134, a lower electrode layer 132, a piezoelectric layer 133, an upper electric layer 131, a second passivation layer 137, an RF input signal line 135 and contact pad layers 136 and 135a are sequentially formed on the sacrificing layer 122a and then patterned, and the sacrificing layer 122a is removed. The piezoelectric actuator 130 can be fabricated with one beam or two or more beams depending on design when the respective layers are patterned.

Preferably, but not necessarily, the sacrificing layer 122a is removed by a chemical mechanical polishing (CMP) process. The sacrificing layer 122a may be formed of polysilicon, low temperature oxide (LTO), tetraethyl orthosilicate (TEOS), polymer for photoresist, metal or alloy. Also, it is preferable, but not necessary, that the respective layers of the lower substrate 120 are patterned to form sidewalls 136a and 136b at the outer circumference of the lower substrate 120 in the same manner as the upper substrate 110.

The membrane layer 134 may be formed of silicon nitride, aluminum nitride, polysilicon oxide, TEOS, Mo, Ta, Pt or Rh.

The upper electrode 131 and the lower electrode 132 may be formed of Pt, Rh, Ta, Au, Mo or AuPt. Preferably, but not necessarily, the upper electrode 131 and the lower electrode 132 may be formed of Pt. Since Pt has a high melting point, diffusion or silicide does not occur when the piezoelectric layer is sintered if Pt is used as the upper electrode 131 or the lower electrode 132.

The piezoelectric layer 133 may be formed of a piezoelectric material such as lead zirconate titanate (PZT), barium titanate, indium tin oxide (ITO), zinc oxide, and aluminum nitride. Most preferably, but not necessarily, the piezoelectric layer 133 may be formed of PZT.

The RF input signal line 135, the RF output signal line 111, contact pad layers 136 and 135, and the terminal pads 121 and 123 are formed of a conductive metal such as Rh, Ti, Ta, Pt, and AuNix. Preferably, but not necessarily, they are formed of Au.

The RF signal lines 111 and 135 are formed of the conductive metal while the piezoelectric actuator 130 is formed of ceramic. When the membrane layer 134 or the piezoelectric layer 133 of a piezoelectric thin film material is fabricated at a high temperature, it is impossible to form a CPW line on the lower substrate 120 positioned to be lower than the piezoelectric actuator 130 in the related art. However, in an exemplary embodiment of the present invention, since the piezoelectric actuator 130 is formed on the lower substrate 120, the CPW line can be formed on the lower substrate 120. Particularly, since electrode lines are formed after the membrane layer 134 is formed, the piezoelectric thin film material can be sintered by the above process order. As a result, it is possible to obtain optimized mechanical displacement of the piezoelectric material. Also, the maximum displacement can be generated by the minimum voltage. Furthermore, in the present invention, since the RF input signal line 135 is formed on the piezoelectric actuator 130, the RF signal lines 111 and 135 contact each other at one point through the contact pad 136. This means that the RF MEMS device 100 can stably be operated.

Afterwards, as shown in FIG. 4F, if the sacrificing layer 122a is removed from the lower substrate 120, the piezoelectric actuator 130 is floated.

Next, as shown in FIG. 5A to FIG. 5C, the upper substrate 110 and the lower substrate 120 are assembled to face each other. To this end, as shown in FIG. 5A, the upper and lower substrates 110 and 120 are fixed to each other so that the sidewall 119 of the upper substrate 110 is positioned to correspond to the sidewalls 136a and 136b of the lower substrate 120 fabricated as above. The upper and lower substrates 110 and 120 are bonded to each other to assemble one package.

Preferably, but not necessarily, the upper and lower substrates 110 and 120 are bonded to each other using Au. After assembly as above, the upper substrate 110 is fabricated in such a manner that the wafer 110*a* is etched to expose the via holes 113 and 115 as shown in FIG. 5B. The contact pad layers 111*b* and 112*b* are formed on the upper substrate 110 to connect upper and lower surfaces of the RF MEMS device 100 with each other through the via holes 113 and 115 (FIG. 5C).

In the RF MEMS device 100 fabricated as above, if a DC voltage is applied to the terminal pads 121 and 123, the piezoelectric actuator 130 is up bent to allow the contact pad 136 to contact the RF output signal line 111. Thus, the RF signal lines 111 and 135 are connected with each other to transmit the RF signal.

The operation of the RF MEMS device 100 according to an exemplary embodiment of the present invention will be described with reference to the accompanying drawings.

Figure 6:
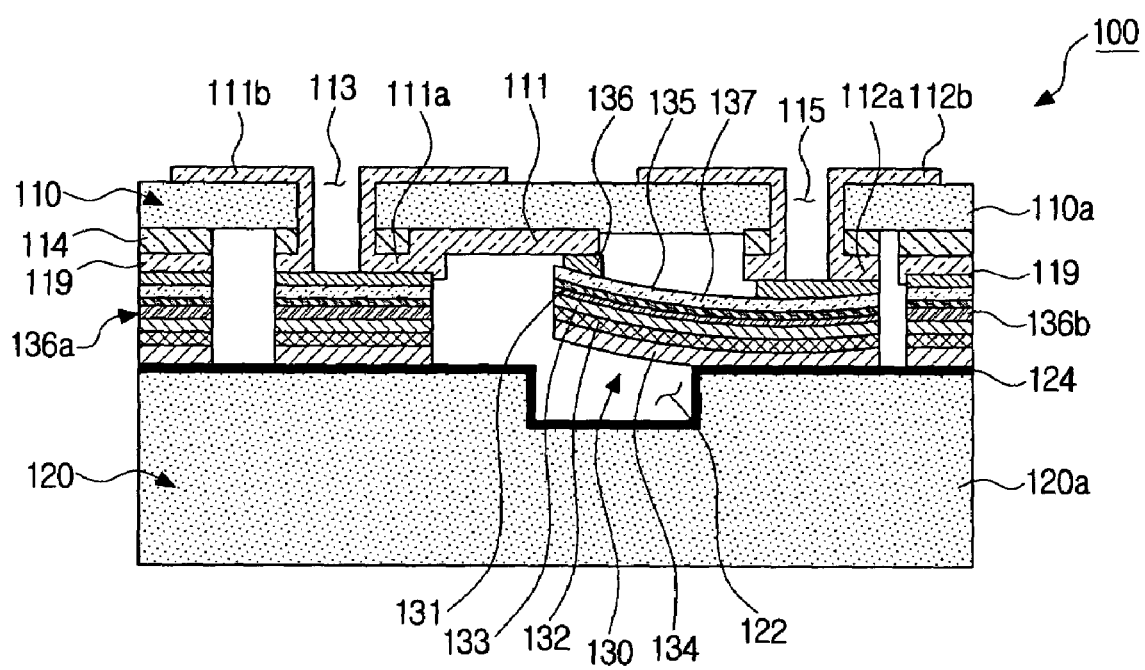
FIG. 6 is a sectional view illustrating the operation of the piezoelectric RF MEMS device according to an exemplary embodiment of the present invention.

FIG. 6 is a sectional view illustrating the operation of the piezoelectric RF MEMS device 100 according to an exemplary embodiment of the present invention. If the DC voltage is applied to the RF MEMS device 100 through the terminal pads 121 and 123 (see FIG. 2C), the DC voltage is applied to the upper and lower electrodes 131 and 132 of the piezoelectric actuator 130. At the same time, polarization occurs in the piezoelectric layer 133 of the piezoelectric actuator 130, and force is applied to the piezoelectric actuator 130. Since the membrane layer 134 is positioned below the piezoelectric actuator 130, the piezoelectric actuator 130 is upward driven as shown in FIG. 6. In other words, dipole moment occurs in the piezoelectric actuator 130 as the voltage is applied to the piezoelectric thin film material constituting the membrane layer 134, whereby the piezoelectric actuator 130 is up-bent. The contact pad 136 and the RF signal lines 111 and 135 contact one another at one contact point through switching of the piezoelectric actuator 130, and the RF signal passes through the RF MEMS device 100.

Figure 7:
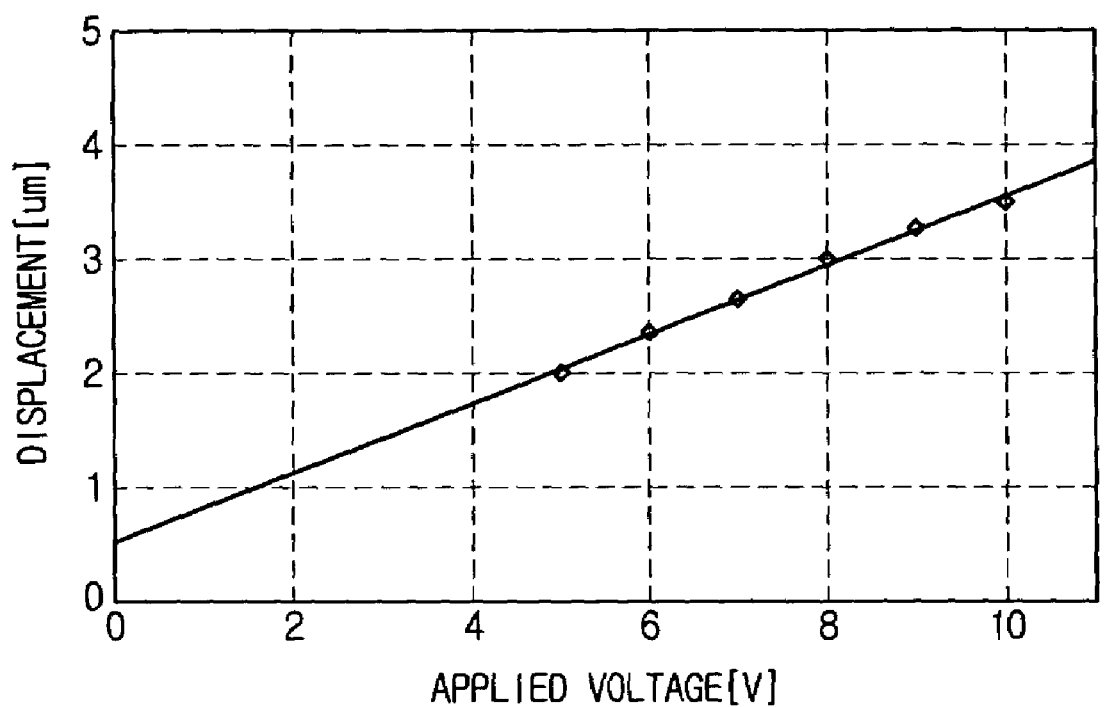
FIG. 7 is a graph illustrating a displacement relation between a voltage applied to the piezoelectric RF MEMS device according to an exemplary embodiment of the present invention and a piezoelectric actuator thereof.

FIG. 7 is a graph illustrating a displacement relation between the voltage applied to the RF MEMS device 100 and the piezoelectric actuator 130. As shown in FIG. 7, it is noted that the piezoelectric actuator 130 is well driven in the RF MEMS device 100 in accordance with the DC voltage. For example, since displacement of 1.5 cm to 2.0 µm is obtained in an exemplary embodiment of the present invention, the RF MEMS device 100 can stably be operated.

As described above, in the present invention, since the RF signal line is formed on the piezoelectric actuator to enable one point contact, the stable operation of the RF MEMS device can be obtained. Also, since the RF MEMS device is provided as one package due to its simple structure, it is possible to achieve miniaturization of the device.

Further, the RF MEMS device can stably be operated at a lower driving voltage without power consumption.

Further, the RF MEMS device can stably be fabricated in accordance with the fabricating method according to the previous exemplary embodiment of the present invention.

The foregoing embodiments and their aspects are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A piezoelectric radio frequency (RF) micro electro mechanical system (MEMS) device comprising:
   an upper substrate comprising a plurality of via holes and an RF output signal line which is connected to a first contact pad formed on a first via hole of the plurality of via holes;
   a piezoelectric actuator positioned below the RF output signal line; and
   a lower substrate comprising a cavity so that one end of the piezoelectric actuator is fixed to the lower substrate and the other end is movably spaced apart from the upper and lower substrates,
   wherein the piezoelectric actuator comprises an RF input signal line and a second contact pad which is provided to connect the RF output signal line with the RF input signal line when the piezoelectric actuator is driven upward,
   wherein the RF input signal line is connected to a third contact pad formed on a second via hole of the plurality of via holes, and
   wherein the plurality of via holes are formed on an upper surface of the upper substrate so that the first and the third contact pads are configured to be connected to each other through the RF output signal line and the RF input signal line when the piezoelectric actuator is driven upward.

2. The piezoelectric RF MEMS device of claim 1, wherein the RF output signal line is formed on a lower surface of the upper substrate.

3. The piezoelectric RF MEMS device of claim 1, wherein the piezoelectric actuator comprises one beam.

4. The piezoelectric RF MEMS device of claim 1, wherein the piezoelectric actuator comprises two or more beams.

5. The piezoelectric RF MEMS device of claim 1, wherein the piezoelectric actuator further comprises at least one of a passivation layer, an electrode, a piezoelectric layer, and a membrane.

6. The piezoelectric RF MEMS device of claim 5,
   wherein the electrode comprises an upper electrode and a lower electrode; and
   wherein the RF input signal line, the passivation layer, the upper electrode, the piezoelectric layer, the lower electrode and the membrane are disposed in the stated order from the top to constitute the piezoelectric actuator.

7. The piezoelectric RF MEMS device of claim 6, wherein the upper electrode and the lower electrode are respectively connected with their driving lines.

8. The piezoelectric RF MEMS device of claim 1, wherein the cavity is positioned below the piezoelectric actuator.

9. The piezoelectric RF MEMS device of claim 1, wherein the contact pad is formed on an upper end of the piezoelectric actuator.

10. The piezoelectric RF MEMS device of claim 1, wherein at least one of the upper substrate and the lower substrate is provided with at least one coplanar waveguide (CPW) line.

11. The piezoelectric RF MEMS device of claim 1, wherein the upper substrate and the lower substrate are bonded to each other.

12. The piezoelectric RF MEMS device of claim 1, further comprising a passivation layer formed on a surface of the lower substrate.

* * * * *